(12) United States Patent
Hamlin

(10) Patent No.: US 6,889,366 B2
(45) Date of Patent: May 3, 2005

(54) SYSTEM AND METHOD FOR COEVOLUTIONARY CIRCUIT DESIGN

(75) Inventor: Christopher L. Hamlin, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 149 days.

(21) Appl. No.: 10/034,839

(22) Filed: Dec. 27, 2001

(65) Prior Publication Data

US 2003/0126562 A1 Jul. 3, 2003

(51) Int. Cl.⁷ .............................................. G06F 17/50
(52) U.S. Cl. ................................ 716/1; 716/18; 703/1; 703/13; 703/14
(58) Field of Search ........................... 716/1, 18; 703/1, 703/13, 14

(56) References Cited

U.S. PATENT DOCUMENTS

| | | | |
|---|---|---|---|
| 4,656,592 A | | 4/1987 | Spaanenburg et al. |
| 5,615,124 A | * | 3/1997 | Hemmi et al. ................. 716/18 |
| 5,742,738 A | * | 4/1998 | Koza et al. .................... 706/13 |
| 5,818,728 A | | 10/1998 | Yoeli et al. |
| 5,818,729 A | | 10/1998 | Wang et al. |
| 6,058,385 A | * | 5/2000 | Koza et al. .................... 706/13 |
| 6,269,277 B1 | | 7/2001 | Hershenson et al. |
| 6,459,136 B1 | | 10/2002 | Amarilio et al. |
| 2003/0097241 A1 | * | 5/2003 | Koford et al. ................. 703/1 |

FOREIGN PATENT DOCUMENTS

| | | |
|---|---|---|
| JP | 01202397 | 7/2001 |
| JP | 02202886 | 7/2002 |

OTHER PUBLICATIONS

O. Hammi et al., CoEvolvable Hardware Platform for Automatic Hardware Design of Neural Networks, Proceedings of IEEE International Conference on Industrial Technology, vol. 1, pp. 509–513, Jan. 2000.*

X. Yao, Following the Path of Evolvable Hardware, Communications of the ACM, vol. 42, Issue 4, pp. 47–49, Apr. 1999.*

M. Shipper et al., Quo Vadis Evolvable Hardware, Communications of the ACM, vol. 42 Issue 4, pp. 50–59, Apr. 1999.*

J. Mizoguchi et al., Production Genetic Algorithms for Automated Hardware Design Through an Evolutinary Process, IEEE World Congress on Computational Intelligence, Proceedings of the First IEEE Conference on Evolutionary Computation, pp. 661–664, Jun. 1994.*

"Self–Reconfigurable Programmable Logic Device" by Reetinder Sidhu, et al.: File # 3115; University of Southern California, Office of Technology Licensing, Los Angeles, CA; www.usc.edu/academe/otl; Sep. 7, 2001.

* cited by examiner

*Primary Examiner*—A. M. Thompson
(74) *Attorney, Agent, or Firm*—Suiter West PC LLO

(57) ABSTRACT

The present invention is directed to a system and method for coevolutionary circuit design. A system suitable for providing integrated circuit design may include a memory suitable for storing a first set of instructions and a second set of instructions and a processor communicatively coupled to the memory. The processor is suitable for performing the first set of instructions and the second set of instructions. The first set of instructions is suitable for configuring a processor to provide an integrated circuit development environment in which a support methodology for an integrated circuit is created. The second set of instructions is suitable for configuring a processor to provide tools for implementing a platform architecture of an integrated circuit in which the platform architecture supplies a structure of the integrated circuit. The first set of instructions and the second set of instructions are linked through at least one formalism so that at least one of an action taken utilizing the platform architecture influences the support methodology and an action taken utilizing the support methodology influences the platform architecture.

3 Claims, 2 Drawing Sheets

SYSTEM AND METHOD FOR COEVOLUTIONARY CIRCUIT DESIGN

CROSS REFERENCE TO RELATED APPLICATIONS

The present application hereby incorporates the following United States Patent Applications by reference in their entirety:

| Attorney Docket Number | Serial No. | Filing Date |
|---|---|---|
| LSI 01-390 | 10/015,194 | Nov. 20, 2001 |
| LSI 01-488 | 10/021,414 | Oct. 30, 2001 |
| LSI 01-489 | 10/021,619 | Oct. 30, 2001 |
| LSI 01-490 | 10/021,696 | Oct. 30, 2001 |
| LSI 01-524 | 10/034,838 | Dec. 27, 2001 |
| LSI 00-695 | 09/842,335 | Apr. 25, 2001 |
| LSI 01-828 | 10/034,648 | Dec. 27, 2001 |

FIELD OF THE INVENTION

The present invention generally relates to the field of integrated circuit design, and particularly to a system and method for coevolutionary circuit design.

BACKGROUND OF THE INVENTION

Integrated circuits are becoming more pervasive in most every aspect of life. Because of the wide range of uses of integrated circuits, there is also a corresponding wide range of circuits designed in a manner to provide the desired functionality in an optimized manner.

Additionally, more and more functions are being included within each integrated circuit. While providing a semiconductor device that includes a greater range of functions supported by the device, inclusion of this range further complicates the design and increases the complexity of the manufacturing process. Such complications further increase the complexity of methodologies needed to utilize this complex functionality.

Further, traditional methods of designing an integrated circuit may not be able to address the every increasing range of device needs as well as the additional complexity required in each device to provide the device requirements. For instance, an integrated circuit may be desired of such complexity that traditional design methods and systems are not able to provide the behaviors desired, such as consistent availability of the functionality, verifiable, predictable, high yielding, and the like.

Therefore, it would be desirable to provide a system and method for designing an integrated circuit utilizing coevolutionary aspects to drive both design of the integrated circuit and the methodologies needed to utilize the design in a unified manner.

SUMMARY OF THE INVENTION

Accordingly, the present invention is directed to a system and method for coevolutionary circuit design. In a first aspect of the present invention, a system suitable for providing integrated circuit design includes a memory suitable for storing a first set of instructions and a second set of instructions and a processor communicatively coupled to the memory. The processor is suitable for performing the first set of instructions and the second set of instructions. The first set of instructions is suitable for configuring a processor to provide an integrated circuit development environment in which a support methodology for an integrated circuit is created. The second set of instructions is suitable for configuring a processor to provide tools for implementing a platform architecture of an integrated circuit in which the platform architecture supplies a structure of the integrated circuit. The first set of instructions and the second set of instructions are linked through at least one formalism so that at least one of an action taken utilizing the platform architecture influences the support methodology and an action taken utilizing the support methodology influences the platform architecture.

In a second aspect of the present invention, a method of designing an integrated circuit includes receiving functional specifications and constraints of an integrated circuit and interacting with a system configured to provide an environment for deriving a support methodology for an integrated circuit having the received functional specifications. The interaction with the support methodology for the integrated circuit influences an environment for designing a platform architecture for the integrated circuit.

In a third aspect of the present invention, a method of designing an integrated circuit includes receiving functional specifications and constraints of an integrated circuit and interacting with a system configured to provide an environment for deriving a platform architecture for an integrated circuit having the received functional specifications. The interaction with the platform architecture for the integrated circuit influences an environment for designing a support methodology for the integrated circuit.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
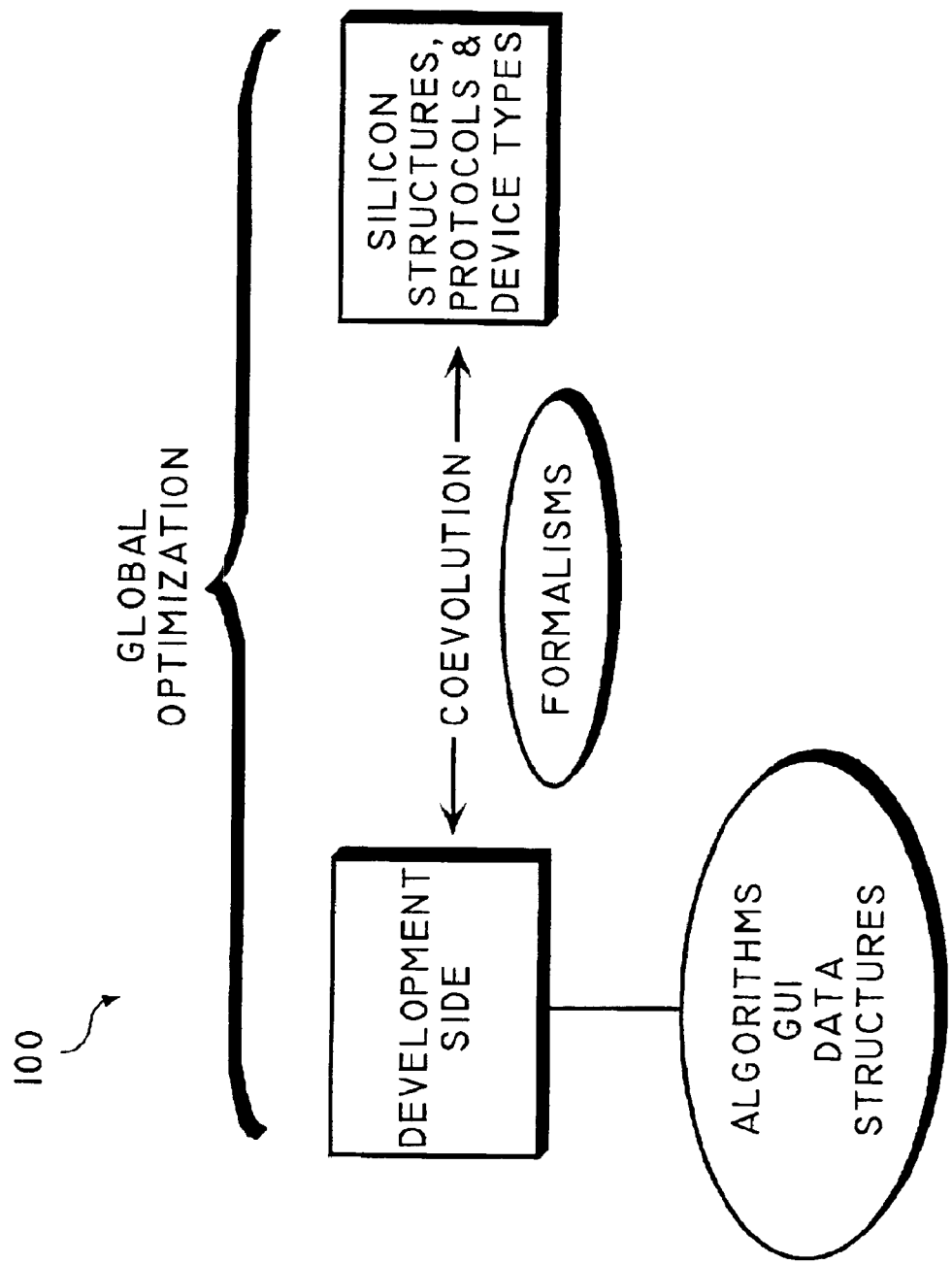
FIG. 1 is an illustration of an embodiment of the present invention wherein a coevolutionary relationship between a support methodology and physical silicon structures is shown.
Figure 2:
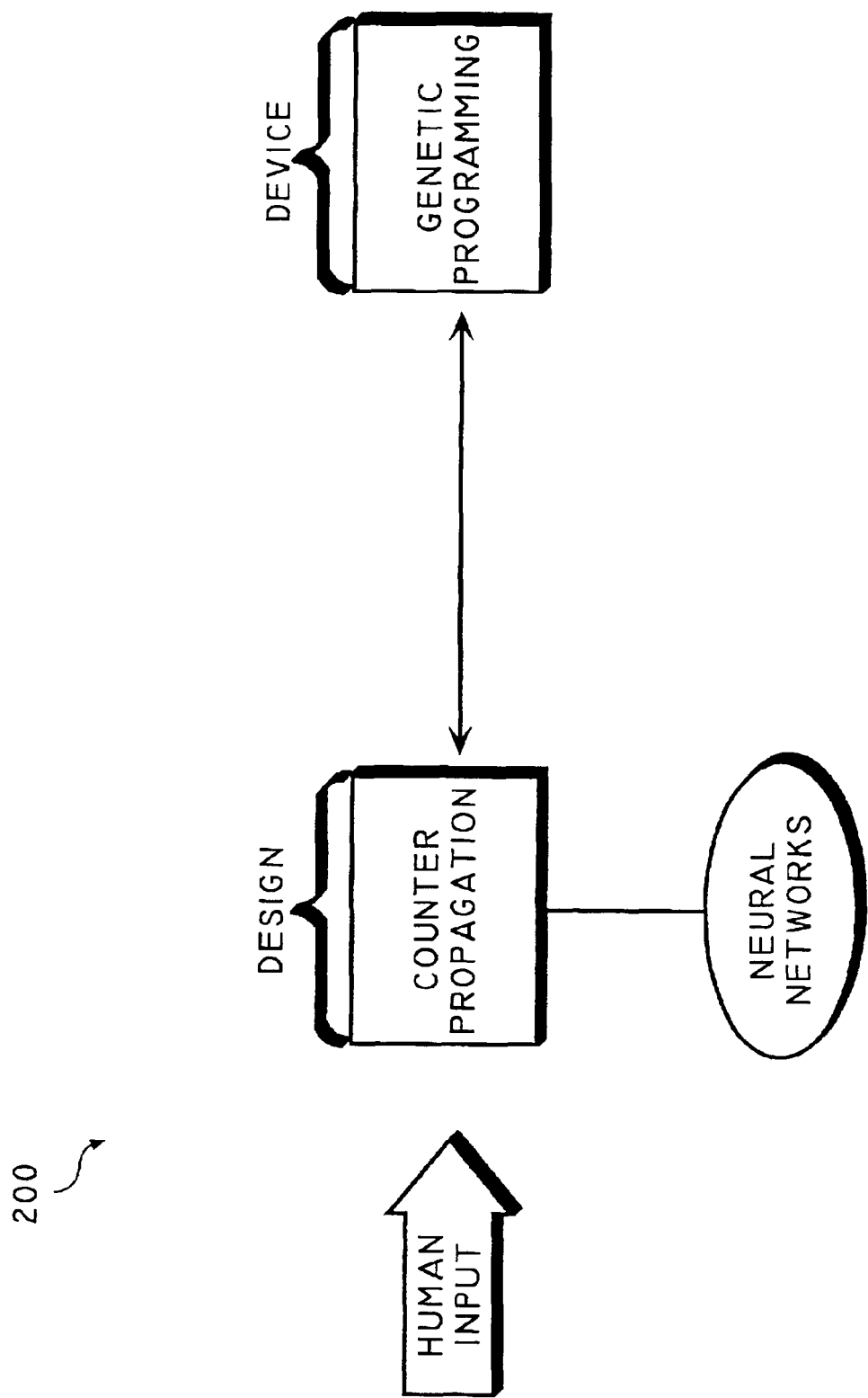
FIG. 2 is an illustration of an embodiment of the present invention wherein a relationship between a support methodology and physical silicon structure as implemented through use of a neural network and genetic programming is shown.

Referring generally now to FIGS. 1 through 2, exemplary embodiments of the present invention are shown. Methodology and metamethodology and the relationship to platform architecture, and the form that this has taken mostly has been in advanced platform architecture, such as reconfigurable processors, embedded programmable logic cores, relationship between these two things that includes the incorporation of nonvolatile writable memory, embedded software techniques, a scalable interconnect, such as an interconnect with isochronous properties, and the like.

When a platform incorporating these aspects is provided, especially in a sea of platforms architecture, two things are apparent. One is that the enormous complexity and the degrees of freedom that this architecture opens up are such that it may not be possible to effectively or productively exploit this richness of capability, flexibility and power without having an advanced methodology that incorporates the features and a much deeper understanding of how to manipulate this potential.

In an aspect of the present invention, algebraic techniques are provided as implemented by a system for mapping between these spaces so that algebras for mapping into complex hardware spaces, performing verification and the like may be utilized for integrated circuit development and design. Additionally, a platform architecture may be provided to handle problems with complexity and advanced deep submicron aspects. To utilize the advanced platform architecture, a methodology, such as a metamethodology, for instance metastreaming and the like, may be provided.

Additionally, coevolutionary aspects are provided for implementation in the design process. The coevolutionary aspect of the present invention may proceed a step further, whereas previously the platform architecture and support methodology were treated as essentially independent, such as concocting a platform architecture or features in it, and then deriving some kind of methodology to support it. By utilizing the present invention, a system may be employed that treats these two spaces as neutrally interacting in a way that will be referred to as coevolutionary.

Coevolution may be developed formally and described mathematically. For instance, in biology, coevolution may be applied so that in a given ecosystem or a pair of ecosystems, two species may be so intertwined that the species evolve in conjunction with one another, so that mutual interactions during evolution influence each species' adaptive properties.

By utilizing the present invention, coevolution may be implemented through formalisms provided to take advantage of mutual interactions to allow algorithms, graphical-user interfaces and data structures to be determined on the development side. The development side may then, in turn, influence the silicon structures and protocols and device types that are actually optimal to implement the structure, given that a class of components operating on the development side in the silicon is available.

In other words, the present invention provides a global optimization that applies across both the development side and structure. Thus, a coevolutionary system and method is provided which may utilize from an algebraic point of view, coevolutionary theory to allow these two aspects to be united and drive them, as it were, as a single system.

For instance, an astronomically increasing computer capability is being driven by microprocessors at ever decreasing prices, such as a 64-bit, two and a half gigahertz microprocessor, costing at most a few hundred dollars, is rapidly declining to a few dozens of dollars. Thus, enormous processing power is available on the design side.

An optimal way of allocating a total task of designing efficient silicon, between the cost effectiveness of this design-side efficiency and the particular classes of structures that are desired of the physical silicon, may be derived by employing this coevolutionary system.

Thus, the cost effectiveness of the design-side efficiency may be capable of altering the cost effectiveness of the actual deployment of silicon in the field, such as for use in cell phones, DVD players, in enterprise solutions, information handling systems, information handling system components such as computers and disk drives, satellites, biometric systems and the like as contemplated by a person of ordinary skill in the art.

The coevolutionary relationship, such as between these two aspects, may be implemented in a system in which physical silicon structures are provided with a design environment that is geared toward this economy of scale that is operating on the design side, unified in a comprehensive view.

One method that may be utilized by a system of the present invention to describe the interactions between the two systems is algebraically. There are a variety of theories that may be employed without departing from the spirit and scope of the present invention, such as a "differential game".

Differential games are a body of theory that is based on variational principles with a calculus of variations. For instance, classical optimal control theory may deal with a determination of an optimal control that optimizes principle subjects to dynamic constraints expressing evolution of a system state under the influence of control variables. If this is extended to the case of multiple design constraints with different and sometimes conflicting optimization criteria, which may be described through a payoff function, differential games may be employed to reach this coevolution and optimization of both the design side and the physical side, even with conflicting constraints.

Zero-sum differential games, also called differential games of pursuit, are a part of differential games. One such example is the "Homicidal Chauffeur". In this canonical differential game, it asks the question, if a chauffeur in a car is in a parking lot and the employer enters the parking lot, the employer has a certain number of degrees of freedom of motion. If the chauffeur is bent on pursuing the employer, what are the optimal strategies? To jointly calculate optimal strategies, various factors may be taken into account, such as weight, acceleration, steering and the like of the car and the maneuverability, flexibility and so on and so forth of the employer, to determine respective optimal pursuit and evasion strategies. Thus, differential games may be used for the analysis of very complex problems of pursuit and evasion, and the like to describe optimal strategies and control.

The previous example may be thought of as a metaphor for the classes of behavior listed in the illustration depicted in FIG. 1. The silicon devices and structures may be thought of as the employer, and the structures are being pursued with the objective of >optimizing the pursuit of structures in a cost-effective and constantly-reduced cost design environments in software.

The mathematics employed in the analysis, such as used in fire-control problems and related to the differential games are relevant, and such as traditional and well understood dynamic programming in which simultaneously varying classes of phenomena are studied to arrive at optimal resolutions of strategies for pursuing them. By applying this theory as discussed to the two very different classes of the present system, optimization and design may be implemented utilizing a coevolutionary structure in a new and useful manner.

Additionally, neural networks on the design side, such as a type of counterpropagation network on the design side, and species of genetic programming on the device side may be employed by the present invention. For instance, work was done by Adrian Thompson in which a chip was able to define itself optimal for the solution of a particular problem. In the case of Thompson, the problem was to have a chip evolve itself to become a highly-reliable tone discriminator capable of discriminating with 100 percent accuracy between one kilohertz and ten kilohertz tones in random bursts. A genetic program was written and given to an FPGA which allowed the FPGA to converge and set a few thousand generations on a successful configuration that would permit the chip to make this discrimination.

Thus, counterpropagation networks and neural networks, such as networks including a Grosberg layer, may be applied to guide the application of genetic programming for the purpose of deriving optimal uses of silicon on the design side.

For instance, an example of the class of coevolutionary relationship between the design side and the silicon side through time as contemplated by the present invention may include a suitable genetic algorithm guiding the unfolding of the actual structures employed and related to a design environment in which the operator, i.e. the designer, was guiding the training of a neural network.

As the complexity of the integrated circuits increase, it may also be desirable to employ heuristics and capabilities on the design side that extend understanding. Ultimately, by providing this type of relationship, it may not be necessary to know how the particular device that is derived from the process works. For example, it is not known how the device derived from Thompson's program works, except at a generalized level.

For instance, the complexity may become so great that only a very general understanding of how the integrated circuit actually operates is possible. In such an instance, a systematic support and heuristic support on the design side for governing the emergence of these extremely complex structures may be desirable. Thus, it is likely that the complexity of the integrated circuits that are being provided will drive the design and implementation process in that direction.

Therefore, the question of how to produce complex behaviors and the like over here, but also the question of how to regulate the emergence of those behaviors so that the behaviors are rendered highly available, verifiable, predictable, high yielding, and the like, so that the behaviors have properties that are desirable in a manufacturing environment needs to be addressed. By providing this coevolutionary relationship, as this enormous complexity emerges on the hardware side, these complex guidance systems, as it were, on the design side may also be developed through the linked formalisms of the coevolutionary relationship.

Further, dynamic programming may also be implemented through use of genetic programming and cybernetics of this dynamic programming relationship between the design side and the device side, as shown in the embodiment 200 illustrated in FIG. 2. For instance, a metastream environment may be provided, for example, with a graphical user interface, with which a human being will interact.

A set of algorithms as implemented by the system is also provided. The inputs may include functional specs and constraints, i.e. in terms of silicon process, gate count, power, area and the like as contemplated by a person of ordinary skill in the art.

For instance, a customer may provide such functional specs and constraints. For example, a customer engagement model may be provided that allows the system to receive and set parameters along those lines, and then apply the parameters on a model of the platform at which the parameters are directed on the device side. For instance, a platform in the sense, such as a sea of platforms architecture with certain capabilities, applied to an environment including embedded arrays, and the like as contemplated by a person of ordinary skill in the art. Additionally, the environment of the present invention may be applied where a sea of platforms architecture ramifies the complexity dealt with so that direct interaction by a designer is difficult. Thus, a level of abstraction provided by the present invention may provide the tools needed by a designer to interact with these complex environments. For instance, low levels on the design side and low levels on the physical side may interact directly, and be manipulated through a system of the present invention at a level of abstraction contemplatable by a designer in an easy manner.

Additional areas are contemplated by the present invention without departing from the spirit and scope thereof. For instance, one of the areas in which this kind of coevolutionary relationship is applicable is between software development and embedded software where the real-time multithreaded software running on the device side may require this extremely intelligent environment to specify the functionality and development.

Further, a second analogous coevolutionary relationship between an interconnect as, for example, in a scalable isochronous interconnect, such as the interconnect described in U.S. patent application Ser. No. 10/021,414, filed Oct. 30, 2001, titled INTERSCALABLE INTERCONNECT, now U.S. Pat. No. 6,654,946, which is hereby incorporated by reference in its entirety, the interconnect characteristics on the one hand and the IP that the interconnect ties together. These two aspects interact mutually and may be thought of as enjoying a coevolutionary relationship because the characteristics of the interconnect and its protocol on the one hand will influence the characteristics of the IP that it is actually hooking up and vice versa.

In an embodiment of the present invention, an intelligent compiler is provided which is guided according to the same kinds of principles described earlier, which is interacting with complex environment, such as realtime embedded multithreaded software implemented through processors running on the device itself, including information handling systems, heterogenous processor types, extensible cores, DSP processors, perhaps traditional processors, tower PCs, and the like, whose software is actually specified by intelligent algorithms and intelligent compilers that operate on the design side.

The present invention may be implemented through the use of underlying algorithms that permit the compilers to emit the correct instruction streams for the multiples of processors on the design side, which currently is being essentially handled manually by the designers. Thus, the present invention supports a kind of coevolutionary relationship between the structures that are actually put into the chip and the environment in which the structures are specified by the designer. In this way, integrated circuits may be supplied that are so complex that the end result is not something that any human being ever fully comprehends.

The present invention may implement classes of algebras suitable for describing a coevolutionary relationship in a design environment for designing an integrated circuit and system employing integrated circuits. For instance, different algebras may be employed, such as L systems, church algebras and the like, in this mutually-interacting coevolutionary framework. The present invention provides independent but tightly-linked bodies of technology on the design side and on the device side that enjoy this kind of symbiotic algebraic coevolutionary explicit linkage with one another.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

Although the invention has been described with a certain degree of particularity, it should be recognized that elements thereof may be altered by persons skilled in the art without departing from the spirit and scope of the invention. One of the embodiments of the invention can be implemented as sets of instructions resident in the memory of one or more information handling systems, which may include memory for storing a program of instructions and a processor for performing the program of instruction, wherein the program of instructions configures the processor and information handling system. Until required by the information handling system, the set of instructions may be stored in another readable memory device, for example in a hard disk drive or in a removable medium such as an optical disc for utilization in a CD-ROM drive and/or digital video disc (DVD) drive, a compact disc such as a compact disc-rewriteable (CD-RW), compact disc-recordable and erasable; a floppy disk for utilization in a floppy disk drive; a floppy/optical disc for utilization in a floppy/optical drive; a memory card such as a memory stick, personal computer memory card for utilization in a personal computer card slot, and the like. Further, the set of instructions can be stored in the memory of an information handling system and transmitted over a local area network or a wide area network, such as the Internet, when desired by the user.

Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the system and method of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A system suitable for providing integrated circuit design, comprising:
   a memory storing a first set of instructions and a second set of instructions; and
   a processor communicatively coupled to the memory, the processor suitable for performing the first set of instructions and the second set of instructions, wherein the first set of instructions is suitable for configuring a processor to provide an integrated circuit development environment in which a support methodology for an integrated circuit is created and the second set of instructions is suitable for configuring a processor to provide tools for implementing a platform architecture of an integrated circuit in which the platform architecture supplies a structure of the integrated circuit, the first set of instructions and the second set of instructions linked through at least one formalism so that at least one of an action taken utilizing the platform architecture influences the support methodology and an action taken utilizing the support methodology influences the platform architecture,
   wherein the formalism includes a differential game, and
   wherein the differential game is a zero sum game.

2. A method of designing an integrated circuit, comprising:
   receiving functional specifications and constraints of an integrated circuit; and
   interacting with a system configured to provide an environment for deriving a support methodology for an integrated circuit having the received functional specifications, wherein the interaction with the support methodology for the integrated circuit influences an environment for designing a platform architecture for the integrated circuit,
   wherein the support methodology influences the environment for designing the platform architecture through the use of a formalism including a differential game, and
   wherein the differential game is a zero sum game including a game of pursuit.

3. A method of designing an integrated circuit, comprising:
   receiving functional specifications and constraints of an integrated circuit; and
   interacting with a system configured to provide an environment for deriving a platform architecture for an integrated circuit having the received functional specifications, wherein the interaction with the platform architecture for the integrated circuit influences an environment for designing a support methodology for the integrated circuit,
   wherein the platform architecture influences the environment for designing the support methodology through the use of a formalism including a differential game, and
   wherein the differential game is a zero sum game including a game of pursuit.

* * * * *